(12) United States Patent  
Yang et al.

(10) Patent No.: US 10,025,155 B2
(45) Date of Patent: Jul. 17, 2018

(54) BOTTOM ELECTRODE SUBSTRATE FOR SEGMENT-TYPE ELECTRO-PHORETIC DISPLAY AND METHOD FOR MANUFACTURING THEREOF

(71) Applicant: E Ink Holdings Inc., Hsinchu (TW)

(72) Inventors: Huai-Tze Yang, Hsinchu (TW); Wei-Juin Chen, Hsinchu (TW); Chien-Chung Huang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 50 days.

(21) Appl. No.: 14/722,142

(22) Filed: May 26, 2015

(65) Prior Publication Data
US 2016/0054635 A1    Feb. 25, 2016

(30) Foreign Application Priority Data
Aug. 22, 2014  (TW) .............. 103129003 A

(51) Int. Cl.
*G02B 26/00* (2006.01)
*G09G 3/34* (2006.01)
(Continued)

(52) U.S. Cl.
CPC ............. *G02F 1/167* (2013.01); *H05K 1/092* (2013.01); *H05K 3/4069* (2013.01);
(Continued)

(58) Field of Classification Search
USPC ........ 359/237, 242, 251–254, 265–267, 315, 359/321, 322, 290–292, 295, 296, 298
See application file for complete search history.

(56) References Cited

U.S. PATENT DOCUMENTS

| 5,838,409 A | 11/1998 | Tomono et al. |
| 7,256,446 B2 * | 8/2007 | Hu .............. G11C 17/16 257/316 |

(Continued)

FOREIGN PATENT DOCUMENTS

| CN | 1453623 A | 11/2003 |
| CN | 101171684 A | 4/2008 |

(Continued)

OTHER PUBLICATIONS

Corresponding Chinese Office Action that these art references were cited dated Sep. 4, 2017.
Corresponding Taiwanese Office Action that these art references were cited dated Nov. 10, 2015.

*Primary Examiner* — Brandi Thomas
(74) *Attorney, Agent, or Firm* — CKC & Partners Co., Ltd.

(57) ABSTRACT

The present disclosure provides a bottom electrode substrate for a segment-type electrophoretic display. The bottom electrode substrate includes a flexible substrate, a first conductive layer, an insulating layer, a second conductive layer and a segment-type electrode. The first conductive layer is disposed on the flexible substrate. The insulating layer covers the first conductive layer and the flexible substrate, wherein the insulating layer has at least one opening exposing a part of the first conductive layer. The second conductive layer is filled in the opening and in contact with the exposed first conductive layer. The segment-type electrode covers the second conductive layer and the insulating layer, and is in contact with the second conductive layer. A method for manufacturing the bottom electrode substrate is also provided herein.

25 Claims, 16 Drawing Sheets

(51) Int. Cl.
  *G02F 1/167* (2006.01)
  *H05K 3/46* (2006.01)
  *H05K 3/40* (2006.01)
  *H05K 1/09* (2006.01)
  *H05K 3/12* (2006.01)
  *H05K 1/03* (2006.01)

(52) U.S. Cl.
  CPC ... *H05K 3/4664* (2013.01); *G02F 2001/1676* (2013.01); *H05K 1/0393* (2013.01); *H05K 3/12* (2013.01); *H05K 2201/0108* (2013.01); *H05K 2201/0145* (2013.01); *H05K 2201/0158* (2013.01); *H05K 2201/0323* (2013.01); *H05K 2201/09854* (2013.01)

(56) References Cited

U.S. PATENT DOCUMENTS

| | | |
|---|---|---|
| 8,222,536 B2 | 7/2012 | Hirata et al. |
| 2009/0015545 A1 | 1/2009 | Kato et al. |
| 2012/0153395 A1* | 6/2012 | Koezuka ............. H01L 27/1288 257/347 |
| 2013/0168706 A1* | 7/2013 | Salam .................... H05B 33/10 257/88 |
| 2014/0000943 A1 | 1/2014 | Kang et al. |

FOREIGN PATENT DOCUMENTS

| | | |
|---|---|---|
| CN | 101271239 A | 9/2008 |
| CN | 102116987 A | 7/2011 |
| CN | 101611341 B | 1/2014 |
| CN | 102445808 B | 7/2014 |

* cited by examiner

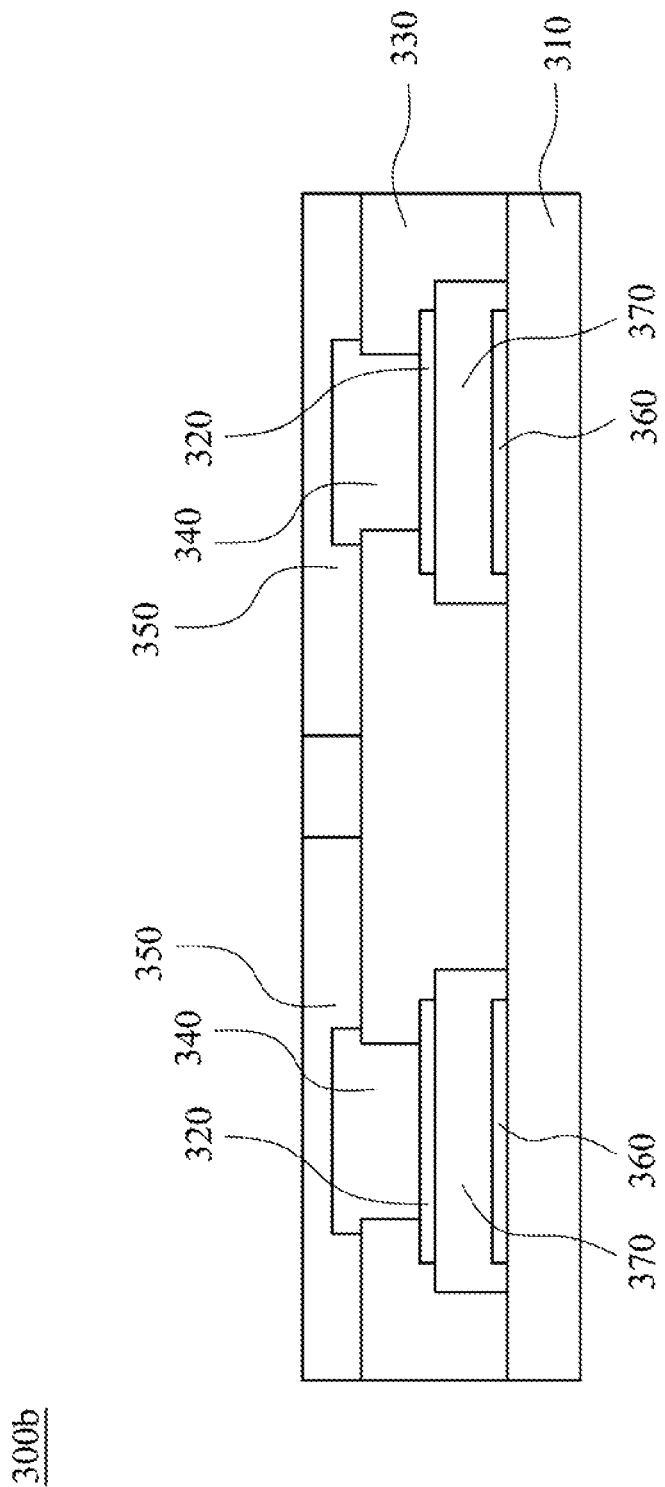

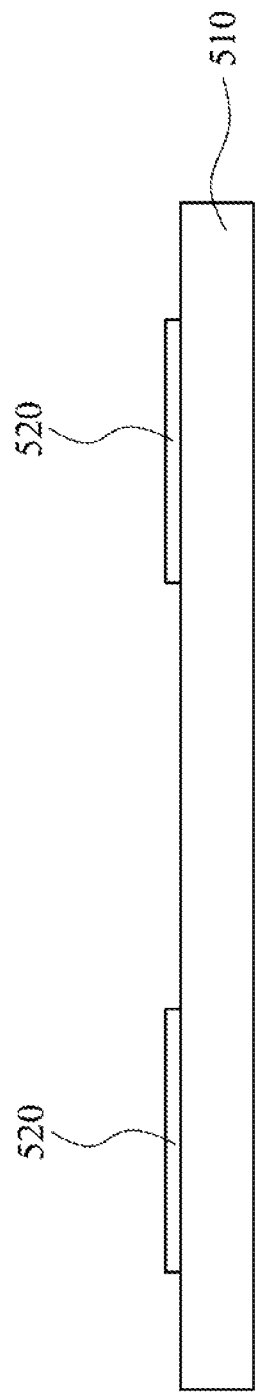

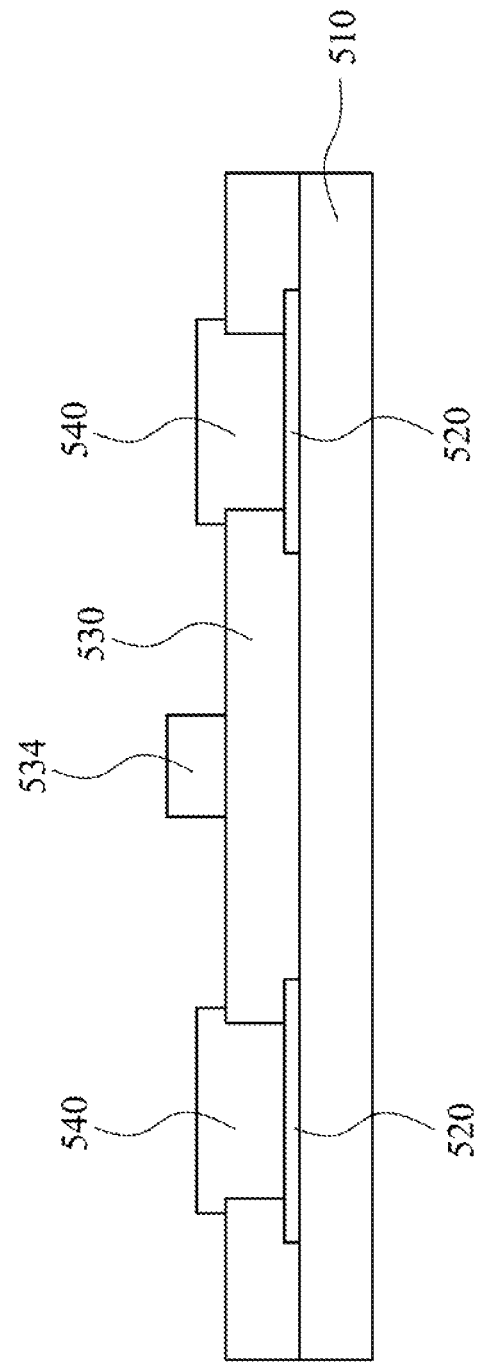

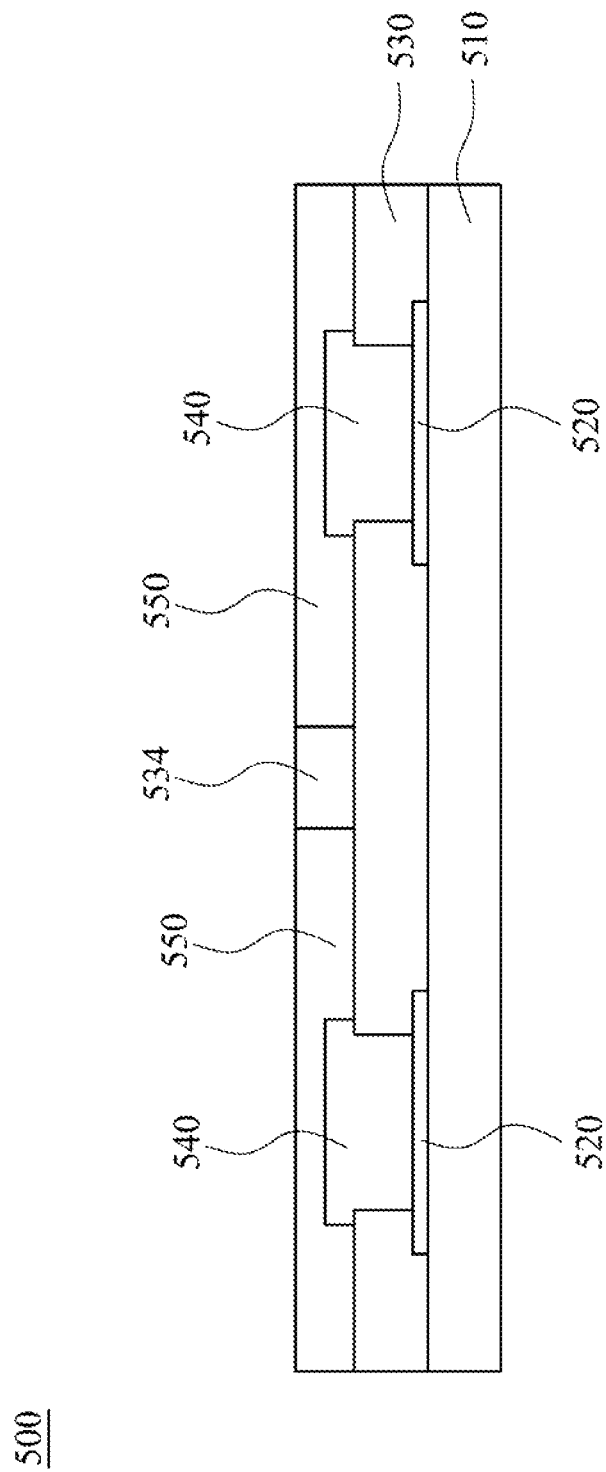

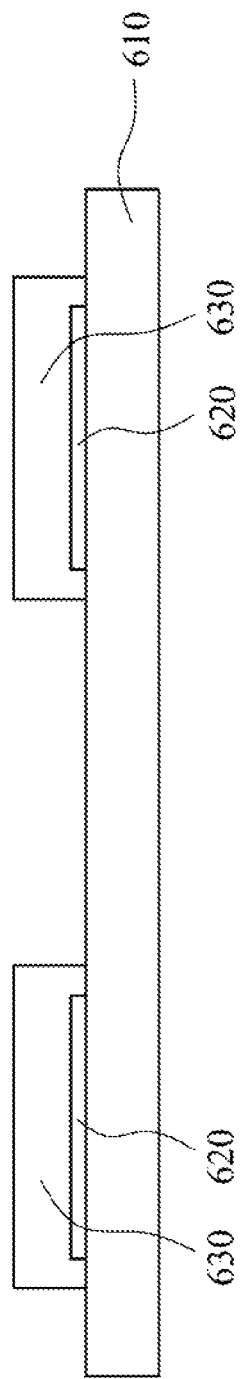

BOTTOM ELECTRODE SUBSTRATE FOR SEGMENT-TYPE ELECTRO-PHORETIC DISPLAY AND METHOD FOR MANUFACTURING THEREOF

RELATED APPLICATIONS

This application claims priority to Taiwanese Application Serial Number 103129003, filed Aug. 22, 2014, which is herein incorporated by reference.

BACKGROUND

Field of Invention

The present disclosure relates to a bottom electrode substrate. More particularly, the present disclosure relates to a bottom electrode substrate for a segment-type electrophoretic display device.

Description of Related Art

In a method for fabricating a general bottom electrode substrate, a drilling process on a substrate is usually performed, and then a silver line and an electrode layer are individually coated on two opposite surfaces of the substrate, wherein the sliver slurry wiring and the electrode layer are electrically connected with each other through a via hole of the substrate. However, if the above mentioned bottom electrode substrate structure is applied to a flexible display device, the via hole of the substrate may be deformed while bending the substrate, which makes a conductive material in the via hole broken to cause a breakage between the silver line and the electrode layer.

On the other hand, the general bottom electrode substrate needs an extra attached back-side protection layer to protect the silver line and prevent moisture infiltrating into the bottom electrode substrate. Thus, the extra attached back-side protection layer may significantly increase the total thickness of the electrode substrate, which is not conducive to the thinning tendency of the flexible display device.

Therefore, there is a need for an improved bottom electrode substrate and a manufacturing method thereof, so as to solve the aforementioned problems met in the art.

SUMMARY

The present disclosure provides a bottom electrode substrate and a manufacturing method thereof to solve the deformation of the via hole making the conductive material broken in the via hole in the general bottom electrode substrate, so as to increase the reliability of the flexible display device. On the other hand, the bottom electrode substrate provided in the present disclosure has a thinner thickness, which may easily provide the thinning tendency of the flexible display device.

An embodiment of the present disclosure is provided a bottom electrode substrate for a segment-type electrophoretic display device including a flexible substrate, a first conductive layer, a first insulating layer, a second conductive layer and a segment-type electrode.

The first conductive layer is disposed on the flexible substrate. The first insulating layer covers the flexible substrate and the first conductive layer, wherein the first insulating layer has at least one opening exposing a part of the first conductive layer. The second conductive layer is filled in the opening and in contact with the exposed first conductive layer. The segment-type electrode covers the second conductive layer and the first insulating layer, and is in contact with the second conductive layer.

The first conductive layer is formed of a first conductive slurry, the second conductive layer is formed of a second conductive slurry, and the segment electrode is formed of a third conductive slurry.

According to various embodiments of the present disclosure, the material of the flexible substrate includes polyethylene terephthalate (PET), poly(methyl methacrylate) (PMMA), polycarbonate (PC), polyethylene (PE), polypropylene (PP) or a combination thereof.

According to various embodiments of the present disclosure, the width of the flexible substrate is in a range of 50-200 µm.

According to various embodiments of the present disclosure, the bottom electrode substrate further includes a third conductive layer sandwiched between the first conductive layer and the flexible substrate; and a second insulating layer sandwiched between the first conductive layer and the third conductive layer, wherein the third conductive layer is formed of a fourth conductive slurry.

According to various embodiments of the present disclosure, the first conductive slurry and the fourth conductive slurry individually include a silver slurry, a carbon slurry, indium-tin-oxide (ITO), indium-gallium-oxide (IGO), indium-zinc-oxide (IZO), indium-gallium-zinc-oxide (IGZO) or a combination thereof.

According to various embodiments of the present disclosure, the thicknesses of the first and the third conductive layers are individually in a range of 5-7 µm.

According to various embodiments of the present disclosure, the materials of the first and the second insulating layers are an epoxy resin.

According to various embodiments of the present disclosure, the thicknesses of the first and the second insulating layers are individually in a range of 10-14 µm.

According to various embodiments of the present disclosure, the opening is a circular opening or a square opening.

According to various embodiments of the present disclosure, the width of the opening is in a range of 0.1-1.0 mm.

According to various embodiments of the present disclosure, a top surface of the second conductive layer and a top surface of the first insulating layer are formed a flat surface.

According to various embodiments of the present disclosure, a top portion of the second conductive layer covers a top surface of the first insulating layer.

According to various embodiments of the present disclosure, the second conductive slurry includes a silver slurry, a carbon slurry or a combination thereof.

According to various embodiments of the present disclosure, the third conductive slurry includes a silver slurry, a carbon slurry or a combination thereof.

According to various embodiments of the present disclosure, the thickness of the segment-type electrode is in a range of 8-12 µm.

According to various embodiments of the present disclosure, a top surface of the segment-type electrode is a flat surface.

Another embodiment of the present disclosure is provided a segment-type display device including the aforementioned bottom electrode substrate, a display unit layer and a transparent conductive layer. The display unit layer is disposed on the bottom electrode substrate, and the transparent conductive layer is disposed on the display unit layer.

According to various embodiments of the present disclosure, the display unit layer includes an E-ink layer, a liquid crystal layer or a light-emitting diode layer.

According to various embodiments of the present disclosure, the material of the transparent conductive layer includes indium-tin-oxide (ITO), indium-gallium-oxide (IGO), indium-zinc-oxide (IZO), indium-gallium-zinc-oxide (IGZO) or a combination thereof.

Further another embodiment of the present disclosure is provided a method for manufacturing a bottom electrode substrate for a segment-type electrophoretic display device. The method includes following steps. A first conductive layer is formed on a flexible substrate. A first insulating layer is formed on the first conductive layer and the flexible substrate, wherein an opening is formed in the first insulating layer to expose a part of the first conductive layer. A second conductive layer is formed in the opening, and the second conductive layer is in contact with the first conductive layer. A segment-type electrode is formed on the second conductive layer and the first insulating layer, wherein the segment-type electrode in contact with the second conductive layer.

According to various embodiments of the present disclosure, the method further includes forming a third conductive layer between the first conductive layer and the flexible substrate; and forming a second insulating layer between the first conductive layer and the third conductive layer.

According to various embodiments of the present disclosure, forming the first and the third conductive layers is forming a silver slurry conductive layer, a carbon slurry conductive layer or a metal oxide conductive layer by a printing method.

According to various embodiments of the present disclosure, forming the first and the second insulating layers is forming an epoxy resin layer by a printing method.

According to various embodiments of the present disclosure, forming the second conductive layer is filling a silver slurry or a carbon slurry in the opening.

According to various embodiments of the present disclosure, forming the segment-type electrode is forming a silver slurry conductive layer, a carbon slurry conductive layer or a metal oxide conductive layer by a printing method.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows:

FIG. 36 is a schematic cross-sectional view of a bottom electrode substrate 300b according an embodiment of the present disclosure;

FIGS. 5A-5E are schematic cross-sectional views at various stages of fabricating a bottom electrode substrate 500 according an embodiment of the present disclosure; and FIGS. 6A-6E are schematic cross-sectional views at various stages of fabricating a bottom electrode substrate 600 according an embodiment of the present disclosure.

DETAILED DESCRIPTION

Figure 1:
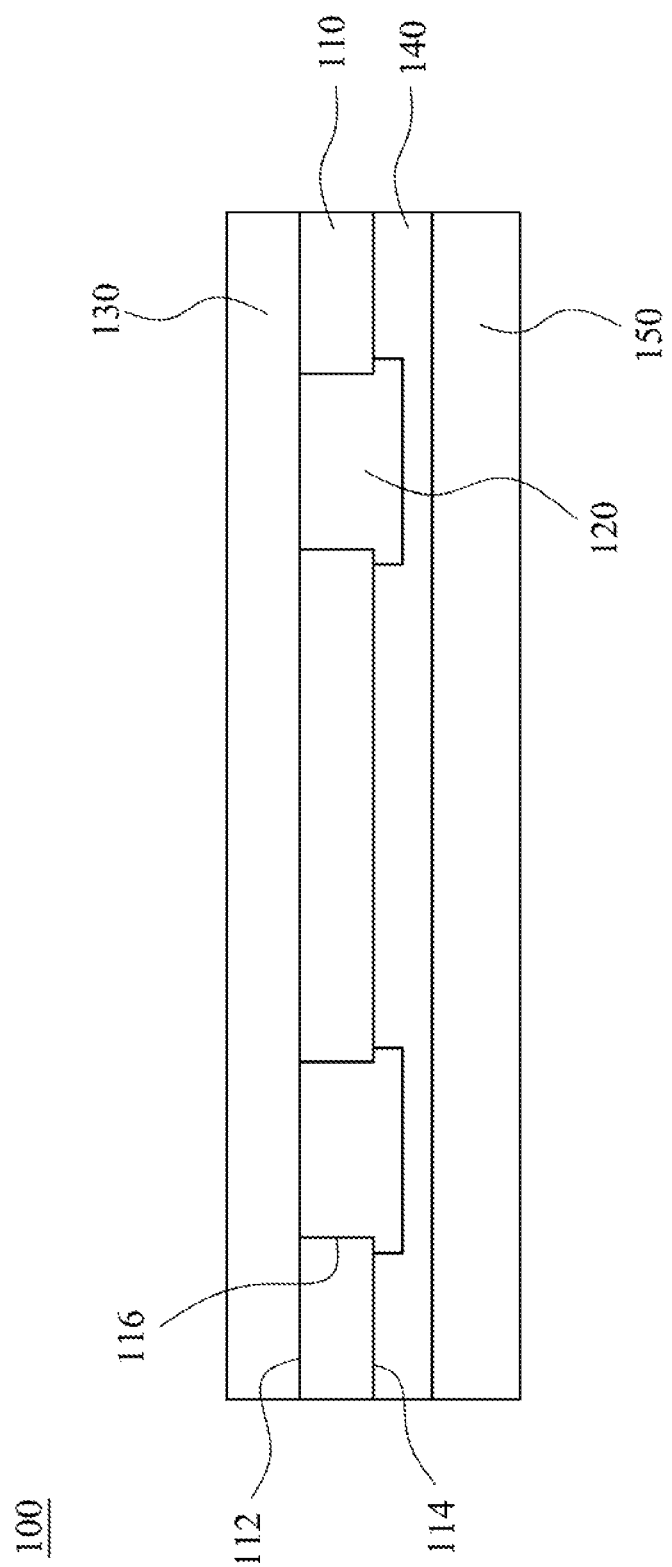
FIG. 1 is a schematic cross-sectional view of a general bottom electrode substrate 100 according a comparative example.

The embodiments of the transparent heat-conducting structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended, rather, these figures are intended for illustration.

Referring to FIG. 1, a schematic cross-sectional view of a general bottom electrode substrate 100 according a comparative example is shown. In FIG. 1, the bottom electrode substrate 100 is commonly composed by a polyethylene terephthalate (PET) substrate 110, a silver slurry layer 120, a segment-type electrode layer 130, an insulating layer 140 and a back-side protection layer 150. The PET substrate 110 has a top surface 112 a bottom surface 114 opposite to the top surface 112 and one or more via holes 116.

The sliver slurry layer 120 is disposed on the bottom surface 114 of the PET substrate 110 and filled in the via hole 116. The segment-type electrode 130 is disposed on the top surface 112 of the substrate 110 and in contact with the silver slurry layer 120 in the via hole 116. In FIG. 1, the insulating layer 140 covers the silver slurry layer 120 and the bottom surface 114 of the PET substrate 110, and the back-side protection layer 150 covers the insulating layer 140, so as to protect silver slurry layer 120 and prevent moisture infiltrating into the bottom electrode substrate 100.

Figure 2A:
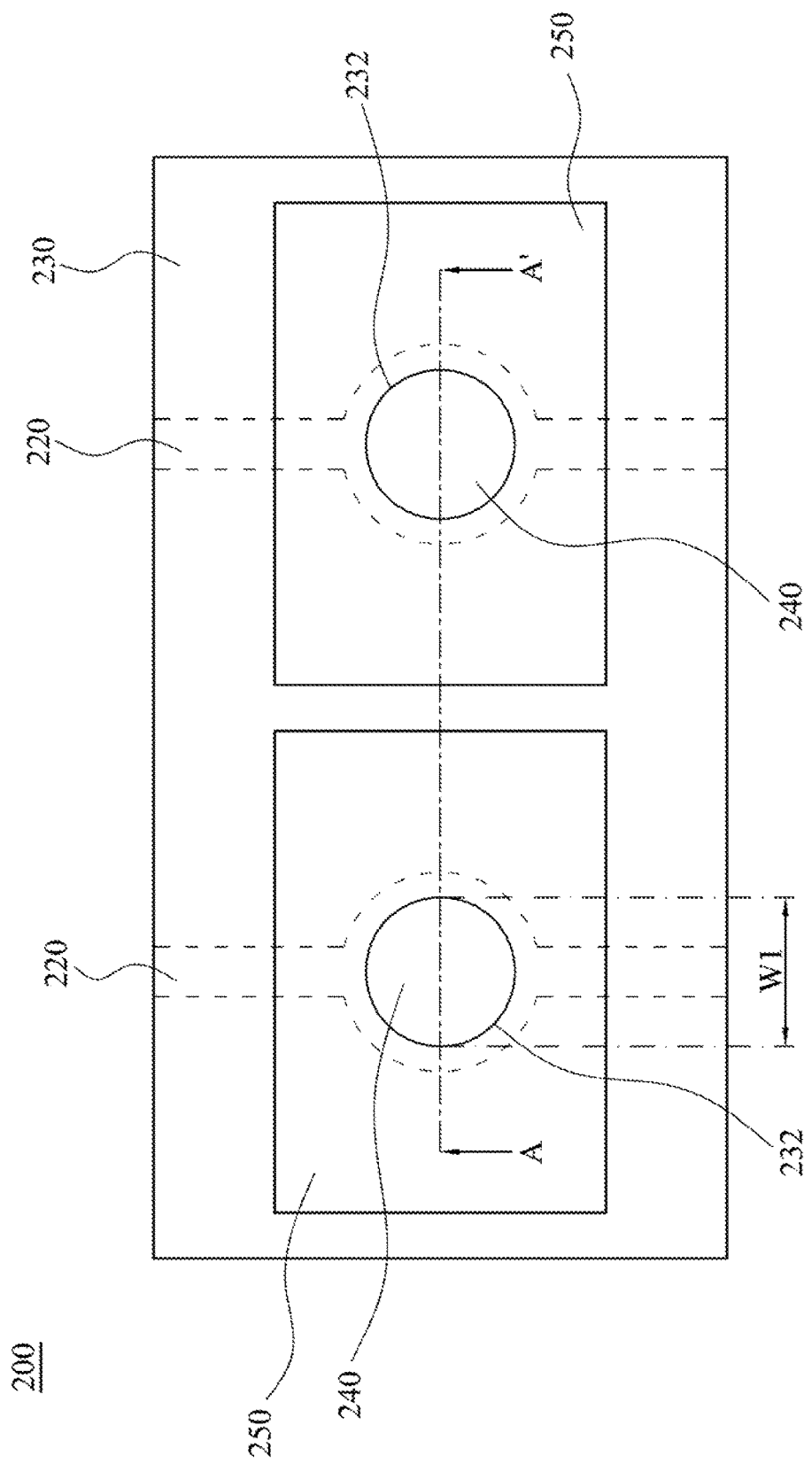
FIG. 2A is a top view of a bottom electrode substrate 200 according an embodiment of the present disclosure.
Figure 2B:
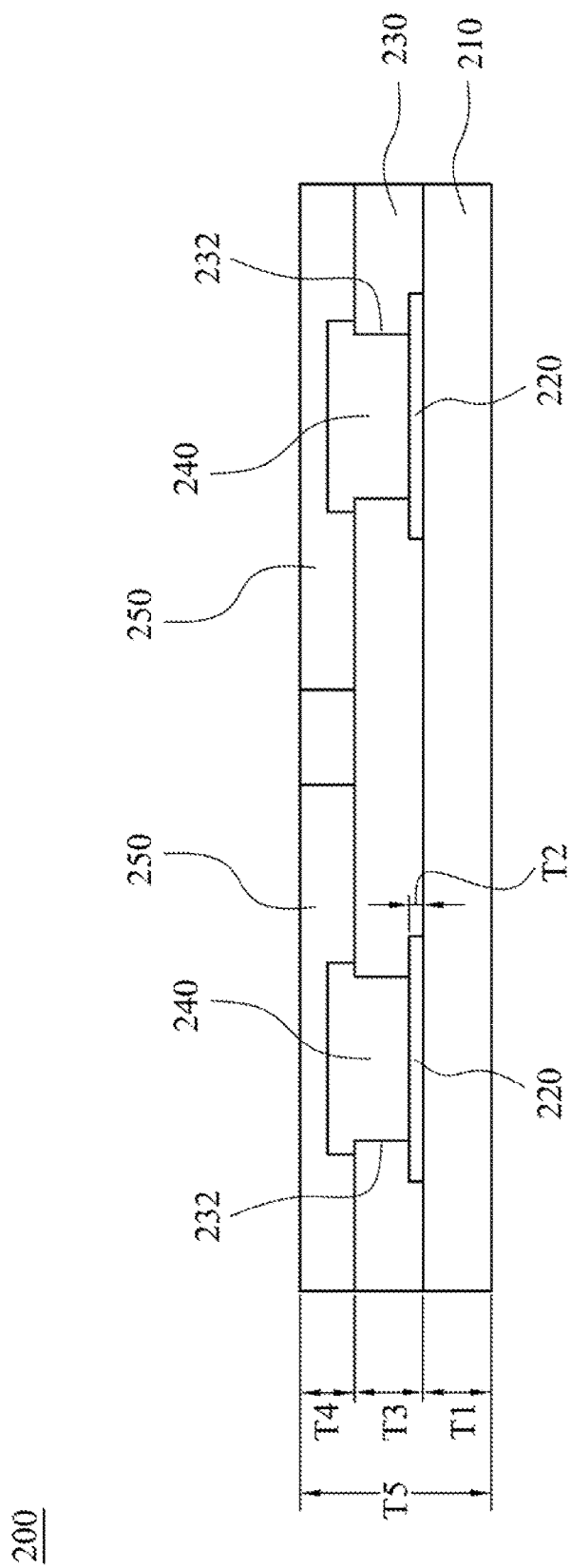
FIG. 2B is a schematic cross-sectional view of the bottom electrode substrate 200 taken along the A-A' line of FIG. 2A.

Referring to FIGS. 2A and 2B, a top view of a bottom electrode substrate 200 and a schematic cross-sectional view of the bottom electrode substrate 200 taken along the A-A' line of FIG. 2A are shown, according an embodiment of the present disclosure.

In FIG. 2A, the bottom electrode substrate 200 includes a flexible substrate 210, a first conductive layer 220, an insulating layer 230, a second conductive layer 240 and a segment-type electrode 250. The insulating layer 230 covers the first conductive layer 220 (the dotted line portion), and the insulating layer 230 has one or more openings 232 exposing a part of the first conductive layer 220. In FIG. 2A, the opening 232 is a circular opening, and the width (W1) of the opening 232 is in a range of 0.1-1.0 mm. In another embodiment of the present disclosure, the opening of the insulating layer may be, but not limited to, a square opening or other geometric shapes.

In FIG. 2B, the first conductive layer 220 is disposed on the flexible substrate 210. In various embodiments of the present disclosure, the material of the flexible substrate 210 includes polyethylene terephthalate (PET), poly(methyl methacrylate) (PMMA), polycarbonate (PC), polyethylene (PE), polypropylene (PP) or a combination thereof. In various embodiments of the present disclosure, the width of the flexible substrate is in a range of 50-200 μm. In various embodiments of the present disclosure, the material of the first conductive layer 220 includes a silver slurry, a carbon slurry, indium-tin-oxide (ITO), indium-gallium-oxide (IGO), indium-zinc-oxide (IZO), indium-gallium-zinc-oxide (IGZO) or a combination thereof. In various embodiments of the present disclosure, the thickness of the first conductive layer 220 is in a range of 5-7 μm.

The insulating layer 230 covers the first conductive layer 220 and the flexible substrate 210, wherein the insulating layer 230 has one or more openings 232 exposing a part of the first conductive layer 220. In various embodiments of the present disclosure, the material of the insulating layer 230 is an epoxy resin. In various embodiments of the present disclosure, the thickness (T3) of the insulating layer 230 is in a range of 10-14 μm.

The second conductive layer 240 is filled in the opening 232 and in contact with the exposed first conductive layer 220. In various embodiments of the present disclosure, the material of the second conductive layer 240 includes a silver slurry, a carbon slurry or a combination thereof. It's worth noting that, in FIG. 2B, the second conductive layer 240 partially covers the insulating layer 230, and forms a T-shaped profile.

The segment-type electrode 250 covers the second conductive layer 240 and insulating layer 230, and is in contact with the second conductive layer 240. In various embodiments of the present disclosure, the material of the segment-type electrode 250 includes a silver slurry, a carbon slurry or a combination thereof. In various embodiments of the present disclosure, the thickness (T4) of the segment-type electrode 250 is in a range of 8-12 μm. In FIG. 2B, a surface of the segment-type electrode 250 opposite to another surface in contact with the second conductive layer 240 is a flat surface. In various embodiments of the present disclosure, two adjacent segment-type electrodes are not in contact with each other, and an insulating material may be applied to separate them.

Compared to the general bottom electrode substrate, the bottom electrode substrate provided by the present disclosure does not need an attached back-side protection layer, which makes the bottom electrode substrate provided by the present disclosure having a thinner thickness, so as to provide the thinning tendency of the segment-type display device. In various embodiments of the present disclosure, the thickness (T5) of the bottom electrode substrate 200 is in a range of 200-400 μm.

Figure 3A:
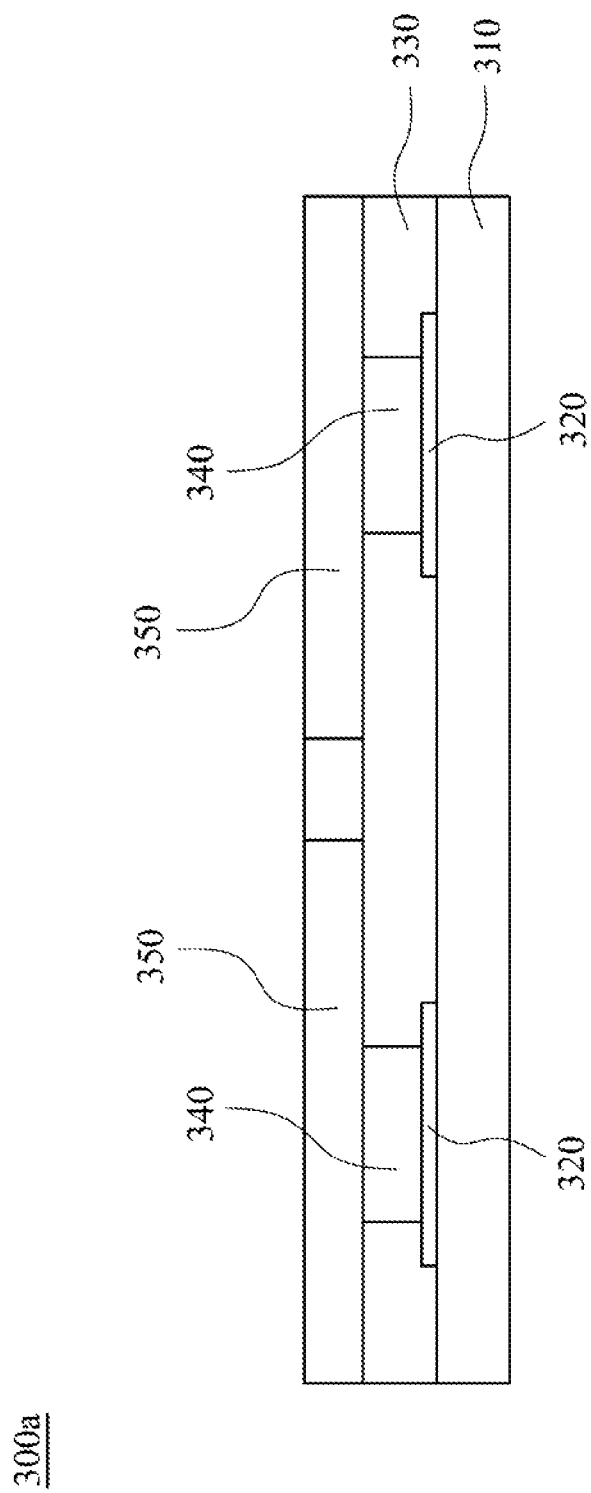
FIG. 3A is a schematic cross-sectional view of a bottom electrode substrate 300a according an embodiment of the present disclosure.

FIG. 3A is a schematic cross-sectional view of a bottom electrode substrate 300a according an embodiment of the present disclosure. In FIG. 3A, the bottom electrode substrate 300a includes a flexible substrate 310, a first conductive layer 320, an insulating layer 330, a second conductive layer 340 and a segment-type electrode 350.

The first conductive layer 320 is disposed on the flexible substrate 310. The insulating layer 330 covers the flexible substrate 310 and the first conductive layer 320, wherein the insulating layer 330 has at least one opening 332 exposing a part of the first conductive layer 320. The second conductive layer 340 is filled in the opening 332 and in contact with the exposed first conductive layer 320. The segment-type electrode 350 covers the second conductive layer 340 and the insulating layer 330, and is in contact with the second conductive layer 340. It's worth noting that, in FIG. 3A, the second conductive layer 340 and the insulating layer 330 are formed a flatten surface.

FIG. 3B is a schematic cross-sectional view of a bottom electrode substrate 300b according an embodiment of the present disclosure. In FIG. 3B, the first conductive layer 320 is disposed on the flexible substrate 310. The first insulating layer 330 covers the flexible substrate 310 and the first conductive layer 320, wherein the first insulating layer 330 has at least one opening 332 exposing a part of the first conductive layer 320. The second conductive layer 340 is filled in the opening 332 and in contact with the exposed first conductive layer 320.

The segment-type electrode 350 covers the second conductive layer 340 and the first insulating layer 330, and is in contact with the second conductive layer 340. In various embodiments of the present disclosure, two adjacent segment-type electrodes 350 are not in contact with each other, and an insulating material may be applied to separate them.

Different from the bottom electrode substrate 200 in FIG. 2B, the bottom electrode substrate 300b further includes a third conductive layer 360 and a second insulating layer 370.

The third conductive layer 360 is sandwiched between the first conductive layer 320 and the flexible substrate 310. The third conductive layer 360 is formed of a fourth conductive slurry. In various embodiments of the present disclosure, the fourth conductive slurry includes a silver slurry, a carbon slurry, indium-tin-oxide (ITO), indium-gallium-oxide (IGO), indium-zinc-oxide (IZO), indium-gallium-zinc-oxide (IGZO) or a combination thereof. In various embodiments of the present disclosure, the third conductive layer 360 is in a range of 5-7 μm.

The second insulating layer 370 is sandwiched between the first conductive layer 320 and the third conductive layer 360. In various embodiments of the present disclosure, the material of the second insulating layer 370 is an epoxy resin. In various embodiments of the present disclosure, the thickness of the second insulating layer 370 is in a range of 10-14 μm.

Figure 4:
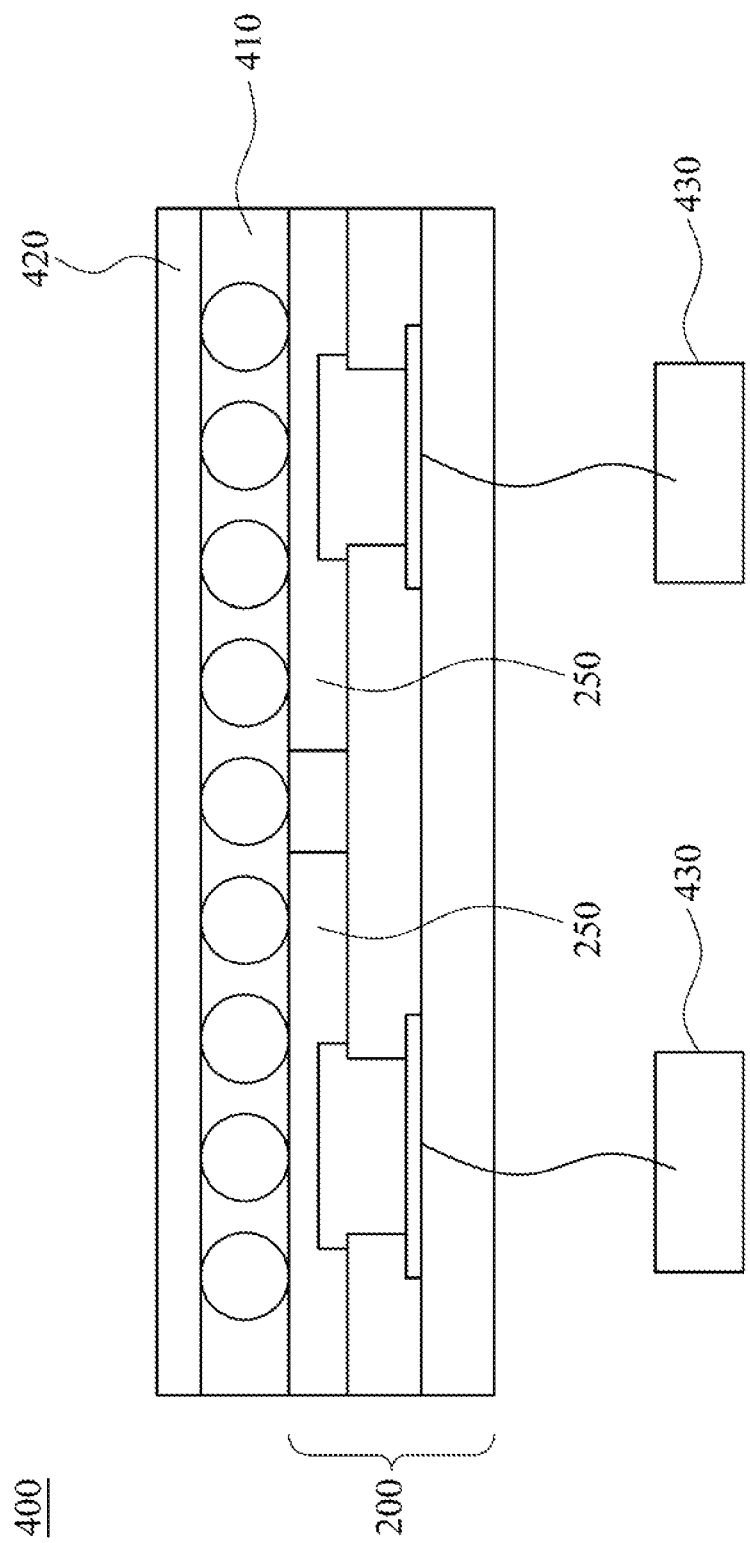
FIG. 4 is a schematic cross-sectional view of a segment-type display device 400 according an embodiment of the present disclosure.

FIG. 4 is a schematic cross-sectional view of a segment-type display device 400 according an embodiment of the present disclosure. In FIG. 4, the segment-type display device 400 includes the bottom electrode substrate 200 as shown in FIG. 2B, a display unit layer 410 and a transparent conductive layer 420. The display unit layer 410 is disposed on the bottom electrode substrate 200, and the transparent conductive layer 420 is disposed on the display unit layer 410.

In various embodiments of the present disclosure, the display unit layer 410 includes an E-ink layer, a liquid crystal layer or a light-emitting diode layer. In various embodiments of the present disclosure, the material of the transparent conductive layer 420 includes indium-tin-oxide (ITO), indium-gallium-oxide (IGO), indium-zinc-oxide (IZO), indium-gallium-zinc-oxide (IGZO) or a combination thereof.

It's worth noting that, the bottom electrode substrate 200 and the transparent conductive layer 420 are individually d posed on two opposite surfaces of the display unit layer 410, and the segment-type electrode 250 of the bottom electrode substrate 200 and the transparent conductive layer 420 are formed an electric field, so that the color of the display unit layer 410 may be changed depending on the opening or closing of the electric field. On the other hand, the first conductive layer 220 of the bottom electrode surface 220 may be electrically connected to one or more switching device 430, and the different switching device 430 may be applied to control a corresponding segment-type electrode 250, so as to control the opening or closing of the electric field. In various embodiments of the present disclosure, the switching device 430 may be, but not limited to, a power switch or a transistor structure. It's worth noting that, the bottom electrode substrate provided by the present disclosure does not include a thin-film transistor.

FIGS. 5A-5E are schematic cross-sectional views at various stages of fabricating a bottom electrode substrate 500 according an embodiment of the present disclosure.

In FIG. 5A, a first conductive layer 520 is formed on a flexible substrate 510. In various embodiments of the present disclosure, forming the first conductive layer 520 is forming a silver slurry conductive layer, a carbon slurry conductive layer or a metal oxide conductive layer by a printing method.

Figure 5B:
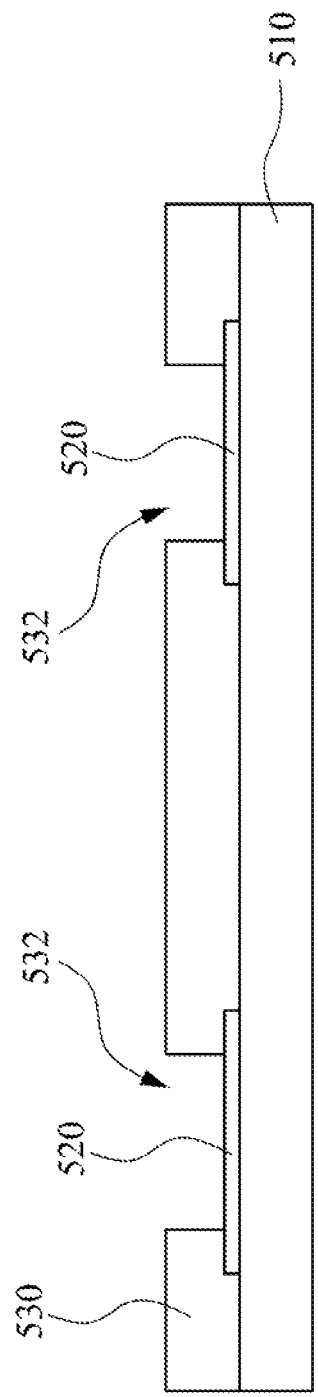

Referring to FIG. 5B, an insulating layer 530 is formed on the first conductive layer 520 and the flexible substrate 510. In various embodiments of the present disclosure, forming the insulating layer 530 is forming an epoxy resin layer by a printing method. In FIG. 5B, an opening 532 is formed in the insulating layer 530 to expose a part of the first conductive layer 520.

Figure 5C:
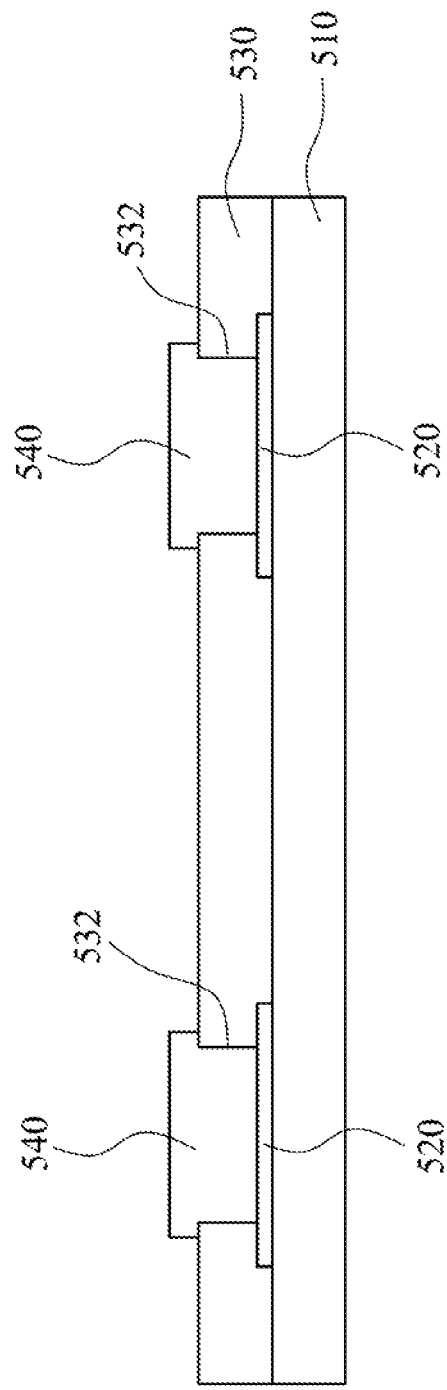

In FIG. 5C, a second conductive layer 540 is formed in the opening 532. The second conductive layer 540 is in contact with the first conductive layer 520. In various embodiments of the present disclosure, forming the second conductive layer 540 is filling a silver slurry or a carbon slurry in the opening 532.

In FIG. 5D, one or more insulating spacers 534 are formed on the insulating layer 530. In various embodiments of the present disclosure, forming the insulating spacer 534 is forming an epoxy resin spacer by a printing method.

In FIG. 5E, a segment-type electrode 550 is formed on the second conductive layer 540 and the insulating layer 530, and the segment-type electrode 550 is in contact with the second conductive layer 540. In various embodiments of the present disclosure, forming the segment-type electrode 550 is forming a silver slurry conductive layer, a carbon slurry conductive layer or a metal oxide conductive layer by a printing method. Its worth noting that, the adjacent segment-type electrodes 550 are not in contact with each other, and are separated by the insulating spacer 534. In various embodiments of the present disclosure, the adjacent segment-type electrode 550 and the insulating spacer 534 are formed a flatten surface.

Figure 6B:
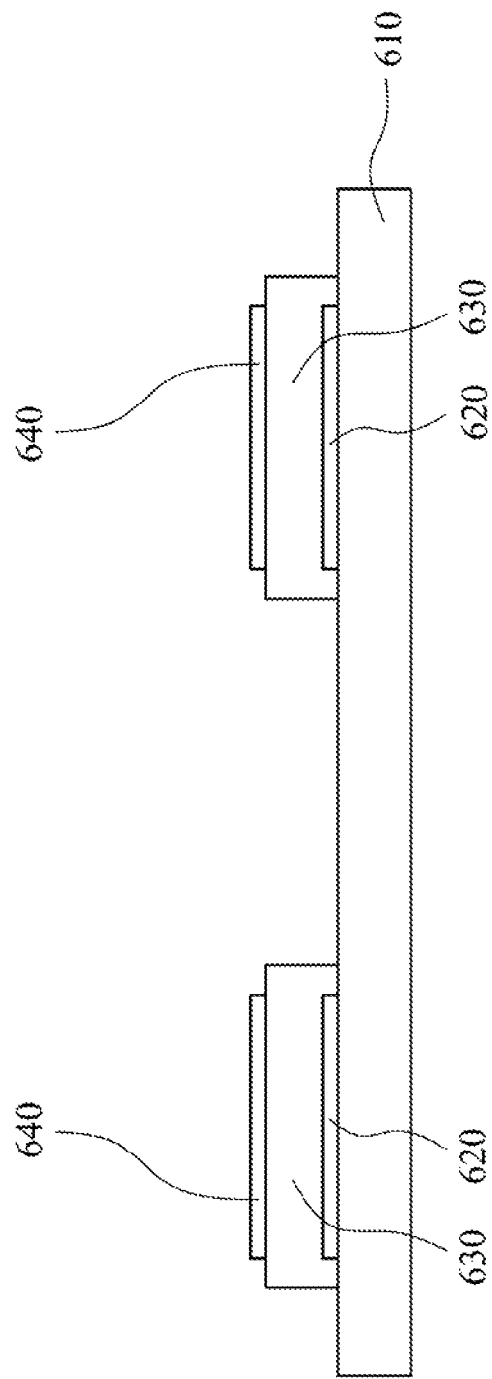

FIGS. 6A-6E are schematic cross-sectional views at various stages of fabricating a bottom electrode substrate 600 according an embodiment of the present disclosure. In FIG. 6A, a first conductive layer 620 is formed on a flexible substrate 610. In various embodiments of the present disclosure, forming the first conductive layer 620 is forming a silver slurry conductive layer, a carbon slurry conductive layer or a metal oxide conductive layer by a printing method.

Additionally, a first insulating layer 630 is formed on the first conductive layer 620 and the flexible substrate 610. In various embodiments of the present disclosure, forming the first insulating layer 630 is forming an epoxy resin layer by a printing method.

In FIG. 6B, a second conductive layer 640 is formed on the first insulating layer 630. In various embodiments of the present disclosure, forming the second conductive layer 640 is forming a silver slurry conductive layer, a carbon slurry conductive layer or a metal oxide conductive layer by a printing method.

Figure 6C:
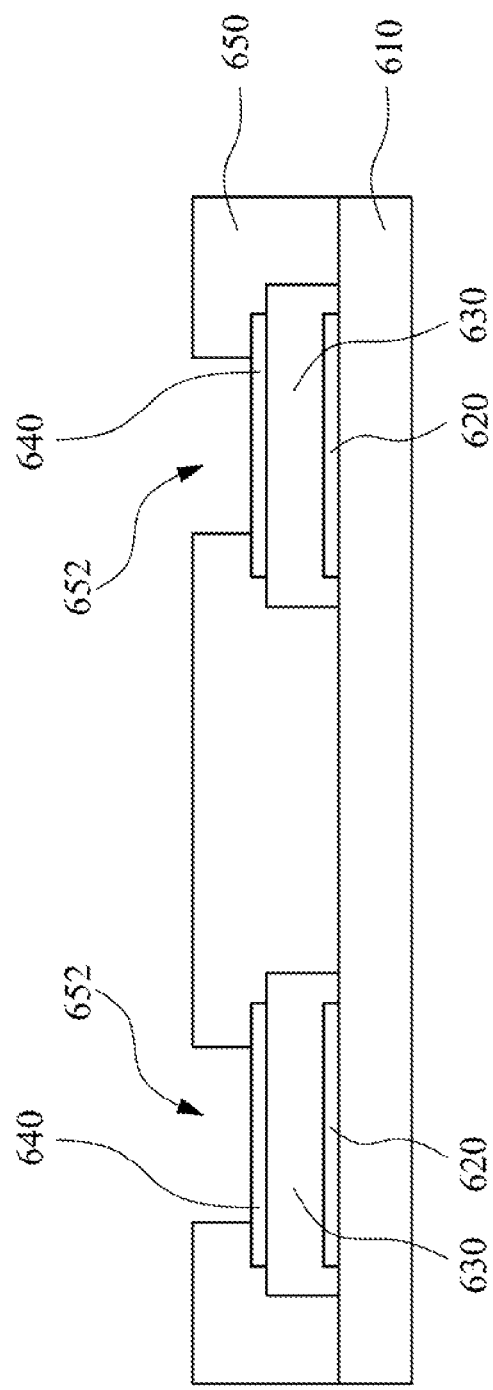

In FIG. 6C, a second insulating layer 650 is formed on the second conductive layer 640 and the first insulating layer 630. In various embodiments of the present disclosure, forming the second insulating layer 650 is forming an epoxy resin layer by a printing method. An opening 652 is formed in the second insulating layer 650 to expose a part of the second conductive layer 640.

Figure 6D:
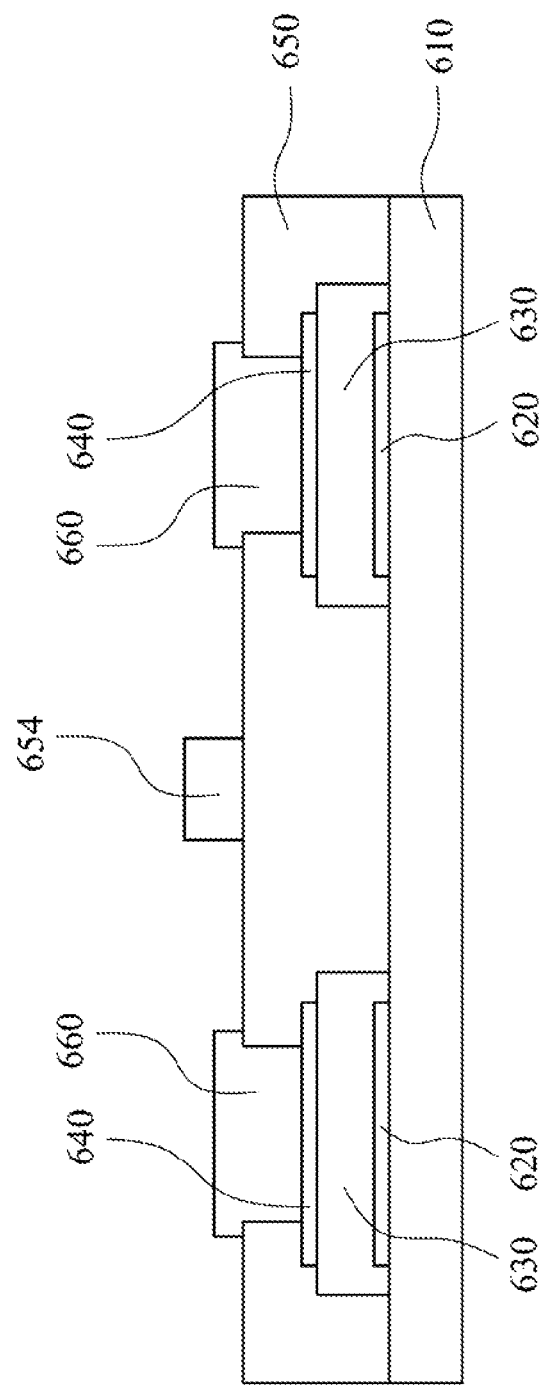

In FIG. 6D, a third conductive layer 660 is formed in the opening 652. The third conductive layer 660 is in contact with the second conductive layer 640. In various embodiments of the present disclosure, forming the third conductive layer 660 is filling a silver slurry or a carbon slurry in the opening 652.

In FIG. 6D, one or more insulating spacers 654 are formed on the second insulating layer 650. In various embodiments of the present disclosure, forming the insulating spacer 654 is forming an epoxy resin spacer by a printing method.

Figure 6E:
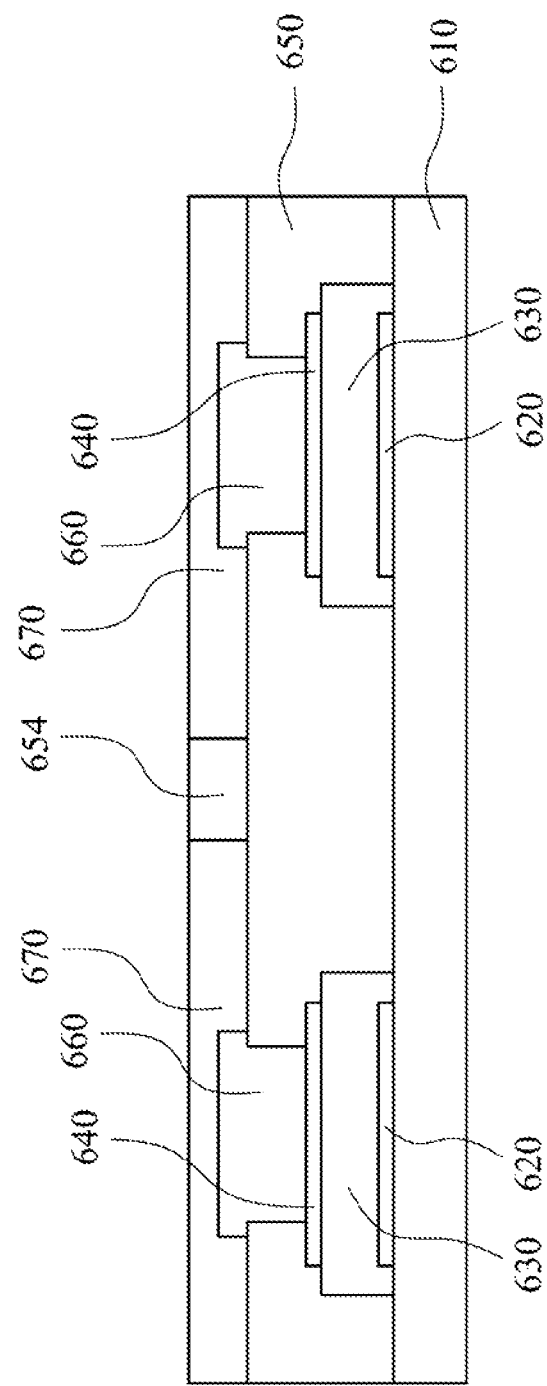

In FIG. 6E, a segment-type electrode 670 is formed on the third conductive layer 660 and the second insulating layer 650, and the segment-type electrode 670 is in contact with the third conductive layer 660. In various embodiments of the present disclosure, forming the segment-type electrode 670 is forming a silver slurry conductive layer, a carbon slurry conductive layer or a metal oxide conductive layer by a printing method. Its worth noting that, the adjacent segment-type electrodes 670 are not in contact with each other, and are separated by the insulating spacer 654. In various embodiments of the present disclosure, the adjacent segment-type electrode 670 and the insulating spacer 654 are formed a flatten surface.

The bottom electrode substrate provided by the present disclosure dose not need a drilling process, so that the first and second conductive layers are not broken while the bottom electrode substrate is bended for a large angle, which makes the reliability of the flexible display device increased.

On the other hand, compared to the general bottom electrode substrate, the bottom electrode substrate provided by the present disclosure does not need an attached backside protection layer, which makes the bottom electrode substrate provided by the present disclosure having a thinner thickness, so as to provide the thinning tendency of the segment-type display device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A bottom electrode substrate for a segment-type electrophoretic display device, comprising:
   a flexible substrate;
   a first conductive layer disposed on the flexible substrate;
   a first insulating layer covering the flexible substrate and the first conductive layer, wherein the first insulating layer has at least one opening exposing a part of the first conductive layer;

a second conductive layer filled in the opening and in direct contact with the exposed first conductive layer, wherein a projection of the second conductive layer on the flexible substrate is completely covered by a projection of the first conductive layer on the flexible substrate, and wherein a width of the projection of the second conductive layer on the flexible substrate is less than a width of the projection of the first conductive layer on the flexible substrate;

a segment-type electrode covering the second conductive layer and the first insulating layer, and in contact with the second conductive layer, wherein the first conductive layer is formed of a first conductive slurry, the second conductive layer is formed of a second conductive slurry, and the segment electrode is formed of a third conductive slurry.

2. The bottom electrode substrate of claim 1, wherein the material of the flexible substrate comprises polyethylene terephthalate (PET), poly(methyl methacrylate) (PMMA), polycarbonate (PC), polyethylene (PE), polypropylene (PP) or a combination thereof.

3. The bottom electrode substrate of claim 1, wherein the width of the flexible substrate is in a range of 50-200 µm.

4. The bottom electrode substrate of claim 1, further comprising a third conductive layer sandwiched between the first conductive layer and the flexible substrate; and a second insulating layer sandwiched between the first conductive layer and the third conductive layer, wherein the third conductive layer is formed of a fourth conductive slurry.

5. The bottom electrode substrate of claim 4, wherein the first conductive slurry and the fourth conductive slurry individually comprise a silver slurry, a carbon slurry, indium-tin-oxide (ITO), indium-gallium-oxide (IGO), indium-zinc-oxide (IZO), indium-gallium-zinc-oxide (IGZO) or a combination thereof.

6. The bottom electrode substrate of claim 4, wherein the thicknesses of the first and the third conductive layers are individually in a range of 5-7 µm.

7. The bottom electrode substrate of claim 4, wherein the materials of the first and the second insulating layers are an epoxy resin.

8. The bottom electrode substrate of claim 4, wherein the thicknesses of the first and the second insulating layers are individually in a range of 10-14 µm.

9. The bottom electrode substrate of claim 1, wherein the opening is a circular opening or a square opening.

10. The bottom electrode substrate of claim 1, wherein the width of the opening is in a range of 0.1-1.0 mm.

11. The bottom electrode substrate of claim 1, wherein a top surface of the second conductive layer and a top surface of the first insulating layer are formed a flat surface.

12. The bottom electrode substrate of claim 1, wherein a top portion of the second conductive layer covers a top surface of the first insulating layer.

13. The bottom electrode substrate of claim 1, wherein the second conductive slurry comprises a silver slurry, a carbon slurry or a combination thereof.

14. The bottom electrode substrate of claim 1, wherein the third conductive slurry comprises a silver slurry, a carbon slurry or a combination thereof.

15. The bottom electrode substrate of claim 1, wherein the thickness of the segment-type electrode is in a range of 8-12 µm.

16. The bottom electrode substrate of claim 1, wherein a top surface of the segment-type electrode is a flat surface.

17. A segment-type display device, comprising:
the bottom electrode substrate of claim 1;
a display unit layer disposed on the bottom electrode substrate; and
a transparent conductive layer disposed on the display unit layer.

18. The segment-type display device of claim 17, wherein the display unit layer comprises an E-ink layer, a liquid crystal layer or a light-emitting diode layer.

19. The segment-type display device of claim 17, wherein the material of the transparent conductive layer comprises indium-tin-oxide (ITO), indium-gallium-oxide (IGO), indium-zinc-oxide (IZO), indium-gallium-zinc-oxide (IGZO) or a combination thereof.

20. A method for manufacturing a bottom electrode substrate for a segment-type electrophoretic display device, comprising:
forming a first conductive layer on a flexible substrate,
forming a first insulating layer on the first conductive layer and the flexible substrate, wherein an opening is formed in the first insulating layer to expose a part of the first conductive layer;
forming a second conductive layer in the opening, wherein the second conductive layer is in direct contact with the first conductive layer, wherein a projection of the second conductive layer on the flexible substrate is completely covered by a projection of the first conductive layer on the flexible substrate, and wherein a width of the projection of the second conductive layer on the flexible substrate is less than a width of the projection of the first conductive layer on the flexible substrate; and
forming a segment-type electrode on the second conductive layer and the first insulating layer, wherein the segment-type electrode is in contact with the second conductive layer.

21. The method of claim 20, further comprising forming a third conductive layer between the first conductive layer and the flexible substrate; and forming a second insulating layer between the first conductive layer and the third conductive layer.

22. The method of claim 21, wherein forming the first and the third conductive layer is forming a silver slurry conductive layer, a carbon slurry conductive layer or a metal oxide conductive layer by a printing method.

23. The method of claim 21, wherein forming the first and the second insulating layers is forming an epoxy resin layer by a printing method.

24. The method of claim 20, wherein forming the second conductive layer is filling a silver slurry or a carbon slurry in the opening.

25. The method of claim 20, wherein forming the segment-type electrode is forming a silver slurry conductive layer, a carbon slurry conductive layer or a metal oxide conductive layer by a printing method.

* * * * *